United States Patent
Yu et al.

(10) Patent No.: US 9,847,500 B2
(45) Date of Patent: Dec. 19, 2017

(54) METHOD FOR MANUFACTURING FLEXIBLE DISPLAY DEVICE AND FLEXIBLE DISPLAY DEVICE SO MANUFACTURED

(71) Applicants: Shenzhen China Star Optoelectronics Technology Co., Ltd., Shenzhen (CN); Wuhan China Star Optoelectronics Technology Co., Ltd., Wuhan (CN)

(72) Inventors: Yun Yu, Shenzhen (CN); Qipei Zheng, Shenzhen (CN)

(73) Assignees: SHENZHEN CHINA STAR OPTOELECTRONICS TECHNOLOGY CO., LTD., Shenzhen, Guangdong (CN); WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 62 days.

(21) Appl. No.: 14/888,453

(22) PCT Filed: Oct. 26, 2015

(86) PCT No.: PCT/CN2015/092791
§ 371 (c)(1),
(2) Date: Nov. 2, 2015

(87) PCT Pub. No.: WO2017/059609
PCT Pub. Date: Apr. 13, 2017

(65) Prior Publication Data
US 2017/0170415 A1    Jun. 15, 2017

(51) Int. Cl.
*H01L 51/00* (2006.01)
*H01L 51/56* (2006.01)

(52) U.S. Cl.
CPC ........ *H01L 51/0097* (2013.01); *H01L 51/003* (2013.01); *H01L 51/56* (2013.01); *H01L 2251/5338* (2013.01)

(58) Field of Classification Search
CPC .................. H01L 51/5237; H01L 51/0097
See application file for complete search history.

(56) References Cited

U.S. PATENT DOCUMENTS

| | | | |
|---|---|---|---|
| 4,990,416 A * | 2/1991 | Mooney | G03F 7/28 430/198 |
| 2003/0183761 A1* | 10/2003 | Hantschel | G01Q 70/06 250/306 |

(Continued)

FOREIGN PATENT DOCUMENTS

| | | |
|---|---|---|
| CN | 104051496 A | 9/2014 |
| CN | 104064685 A | 9/2014 |

*Primary Examiner* — Kyoung Lee
*Assistant Examiner* — Christina Sylvia
(74) *Attorney, Agent, or Firm* — Leong C. Lei

(57) ABSTRACT

The present invention provides a method for manufacturing a flexible display device and a flexible display device so manufactured. The method for manufacturing a flexible display device according to the present invention uses a connection layer to replace a release layer and a bonding layer that are commonly used in the prior art so as to enhance the bonding strength between a flexible backing plate and a rigid carrier board and to additionally function as a release layer for easily achieving separation between the flexible backing plate and the rigid carrier board; and further, a thermal isolation layer is provided on one side or two sides of the soft glass plate to isolate heat generated in a high temperature process, an ELA process, or a laser based separation process and thus reduce thermal impact caused the heat on the soft glass plate and the display device so as (Continued)

to prevent cracking resulting from increase of brittleness of the soft glass plate and enhance performance of a flexible display device.

12 Claims, 4 Drawing Sheets

(56) References Cited

U.S. PATENT DOCUMENTS

| | | | |
|---|---|---|---|
| 2007/0091062 A1* | 4/2007 | French | G02F 1/133305 345/107 |
| 2010/0019654 A1* | 1/2010 | Hayashi | H01L 51/5256 313/498 |
| 2010/0087316 A1* | 4/2010 | Day | B41M 5/34 503/204 |
| 2014/0323006 A1* | 10/2014 | Song | H01L 51/003 445/24 |

* cited by examiner

METHOD FOR MANUFACTURING FLEXIBLE DISPLAY DEVICE AND FLEXIBLE DISPLAY DEVICE SO MANUFACTURED

BACKGROUND OF THE INVENTION

1. Field of the Invention

The present invention relates to the field of display technology, and in particular to a method for manufacturing a flexible display device and a flexible display device so manufactured.

2. The Related Arts

Organic light emitting display (OLED) has various advantages, such as being self-luminous, low driving voltage, high light emission efficiency, short response time, high definition and contrast, approximately 180° view angle, wide temperature range of applications, and being capable of flexible displaying and large area full color displaying, and thus has an increasingly widened application and is considered a display device having the greatest development potential in the business. With the progress of OLED technology, the advantage of the OLED for being flexible provides the development of a flexible OLED display device, which due to the characteristics of being flexible and easy to carry, is now a major sector of research and development of the field of display technology.

Base plates that are currently usable in a flexible OLED display device include thin stainless steel plates, polymeric plastics, and soft glass sheets. Among them, the thin stainless steel plates have high surface roughness and must involve a planarization layer in the application thereof, making the cost high. The polymeric plastic sheets and the soft glass sheets are the current hot spots of research study. For a manufacturing process of a flexible OLED display device, intact separation of a flexible base plate and a glass carrier is a key technique of the manufacturing process.

As shown in FIG. 1, a schematic view is provided for illustrating a conventional structure of a blank plate of a flexible base plate. The blank plate of a flexible base plate comprises a carrier plate 10, a release layer 20 formed on the carrier plate 10, a bonding layer 30 formed on the release layer 20, and a soft glass plate 40 bonded to the bonding layer 30. In manufacturing a flexible display device, it also needs to make a display structure unit and a package structure unit on the soft glass plate 40 and finally, a laser based separation process is applied to separate the flexible display device from the carrier plate 10.

Compared to a plastic film, the soft glass plate possesses electric performance similar to that of rigid glass and has certain capability of resisting moisture and oxygen. However, the above-described known technique suffers certain problems. The conventional OLED display devices often use low-temperature poly-silicon (LTPS) thin-film transistor (TFT) technology or oxide semiconductor (OS) TFT technology and thus, in an excimer laser annealing (ELA) process, a high temperature operation and a laser based separation operation inevitably lead to an increase of the brittleness of the soft glass plate, making cracking generated on and expanded through the soft glass plate thereby affecting the performance of the display structure unit arranged on a top of the soft glass plate and lowering down the product yield rate.

SUMMARY OF THE INVENTION

An object of the present invention is to provide a method for manufacturing a flexible display device that reduces thermal impact caused on a soft glass plate by heat induced in a high temperature process and a laser based process so as to prevent increase of brittleness of the soft glass plate and influence on the performance and product yield rate of a display component.

The object of the present invention is also to provide a flexible display device, which comprises a soft glass plate that is free of cracking and a display component that shows excellent performance, and is easy to manufacture and the product yield rate being high.

To achieve the above objects, the present invention provides a method for manufacturing a flexible display device, which comprises the following steps:

(1) providing a carrier board and depositing a connection layer on the carrier board by plasma enhanced chemical vapor deposition (PECVD);

(2) forming a flexible base plate on the connection layer, wherein the flexible base plate comprises a soft glass plate and a thermal isolation layer that is provided on at least one side of the soft glass plate;

(3) forming a blocking layer on the flexible base plate;

(4) forming a display structure unit and a package structure unit that is arranged on the display structure unit on the blocking layer; and (5) applying a laser based process to separate the carrier board and the flexible base plate with the connection layer attached to the flexible base plate so as to obtain a flexible display device, wherein the flexible display device comprises the flexible base plate, the connection layer that is on a lower surface of the flexible base plate, a blocking layer that is on an upper surface of the flexible base plate, the display structure unit on the blocking layer, and the package structure unit on the display structure unit.

The flexible base plate comprises a soft glass plate and a thermal isolation layer arranged on a side of the soft glass plate that is close to the blocking layer.

Alternatively, the flexible base plate comprises a soft glass plate and a thermal isolation layer arranged on a side of the soft glass plate that is close to the connection layer.

Alternatively, the flexible base plate comprises a soft glass plate, a first thermal isolation layer arranged on a side of the soft glass plate that is close to the connection layer, and a second thermal isolation layer arranged on a side of the soft glass plate that is close to the blocking layer.

The connection layer comprises a $SiO_2$ layer or a $SiN_x$ layer; the thermal isolation layer is formed of a temperature-resistant insulating thermally-isolating material; and the blocking layer comprises one of a $SiO_2$ layer, a $SiN_x$ layer, and a composite layer formed by alternately stacking a $SiO_2$ layer and a $SiN_x$ layer.

The present invention also provides a flexible display device, which comprises a flexible base plate, a connection layer arranged on a lower surface of the flexible base plate, a blocking layer arranged on the flexible base plate, a display structure unit arranged on the blocking layer, and a package structure unit arranged on the display structure unit;

wherein the flexible base plate comprises a soft glass plate and a thermal isolation layer that is provided on at least one side of the soft glass plate.

The flexible base plate comprises a soft glass plate and a thermal isolation layer arranged on a side of the soft glass plate that is close to the blocking layer.

Alternatively, the flexible base plate comprises a soft glass plate and a thermal isolation layer arranged on a side of the soft glass plate that is close to the connection layer.

Alternatively, the flexible base plate comprises a soft glass plate, a first thermal isolation layer arranged on a side of the soft glass plate that is close to the connection layer, and a second thermal isolation layer arranged on a side of the soft glass plate that is close to the blocking layer.

The connection layer comprises a $SiO_2$ layer or a $SiN_x$ layer; the thermal isolation layer is formed of a temperature-resistant insulating thermally-isolating material; and the blocking layer comprises one of a $SiO_2$ layer, a $SiN_x$ layer, and a composite layer formed by alternately stacking a $SiO_2$ layer and a $SiN_x$ layer.

The present invention further provides a flexible display device, which comprises a flexible base plate, a connection layer arranged on a lower surface of the flexible base plate, a blocking layer arranged on the flexible base plate, a display structure unit arranged on the blocking layer, and a package structure unit arranged on the display structure unit;

wherein the flexible base plate comprises a soft glass plate and a thermal isolation layer that is provided on at least one side of the soft glass plate;

wherein the flexible base plate comprises a soft glass plate and a thermal isolation layer arranged on a side of the soft glass plate that is close to the blocking layer; and wherein the connection layer comprises a $SiO_2$ layer or a $SiN_x$ layer; the thermal isolation layer is formed of a temperature-resistant insulating thermally-isolating material; and the blocking layer comprises one of a $SiO_2$ layer, a $SiN_x$ layer, and a composite layer formed by alternately stacking a $SiO_2$ layer and a $SiN_x$ layer.

The efficacy of the present invention is that the present invention provides a method for manufacturing a flexible display device and a flexible display device so manufactured. The method for manufacturing a flexible display device according to the present invention uses a connection layer to replace a release layer and a bonding layer that are commonly used in the prior art so as to enhance the bonding strength between a flexible backing plate and a rigid carrier board and to additionally function as a release layer for easily achieving separation between the flexible backing plate and the rigid carrier board; and further, a thermal isolation layer is provided on one side or two sides of the soft glass plate to isolate heat generated in a high temperature process, an ELA process, or a laser based separation process and thus reduce thermal impact caused the heat on the soft glass plate and the display device so as to prevent cracking resulting from increase of brittleness of the soft glass plate and enhance performance of a flexible display device.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings:

FIG. 4 is also a schematic view illustrating a flexible display device according to the first embodiment of the present invention;

FIG. 6 is also a schematic view illustrating a flexible display device according to the second embodiment of the present invention; FIG. 4 is also a schematic view illustrating a flexible display device according to the third embodiment of the present invention.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
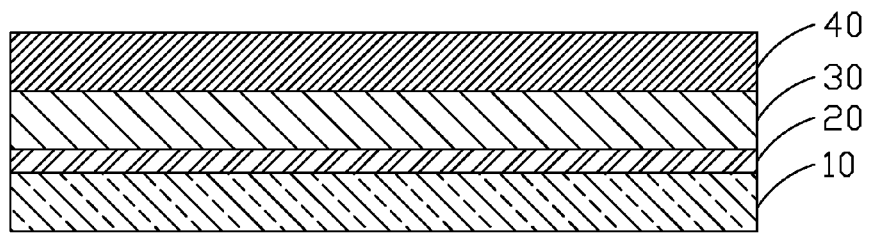
FIG. 1 is a schematic view illustrating a conventional structure of a blank plate of a flexible base plate.
Figure 2:
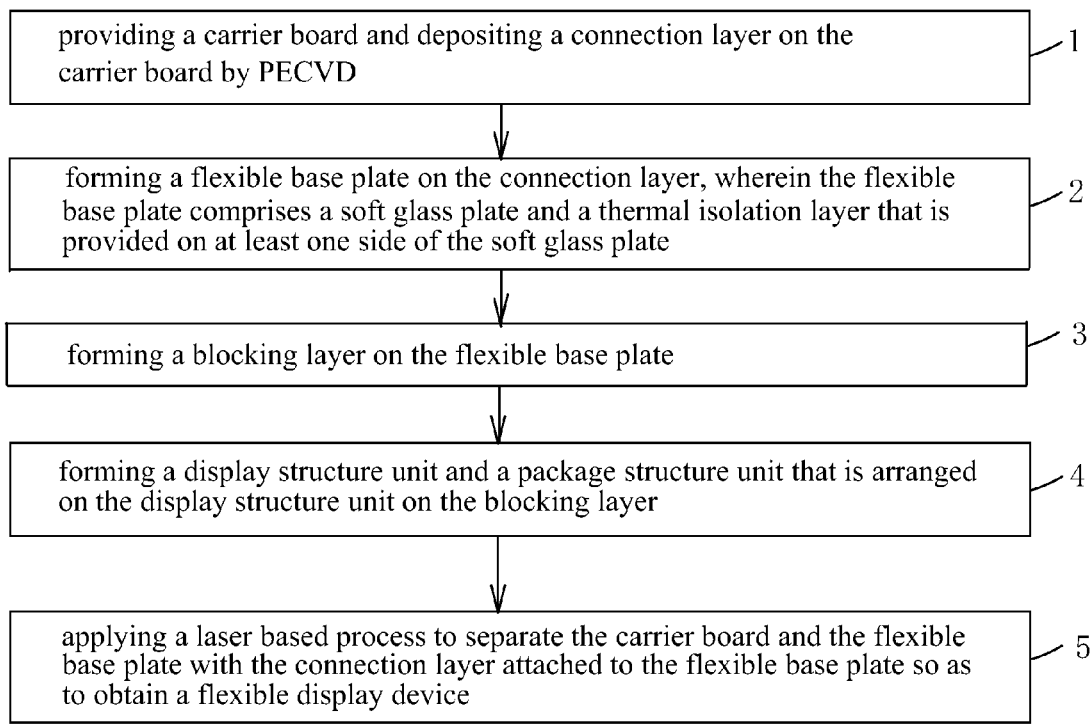
FIG. 2 is a flow chart illustrating a method for manufacturing a flexible display device according to the present invention.

Referring to FIG. 2, the present invention provides a method for manufacturing a flexible display device, which comprises the following steps:

Step 1: providing a carrier board 1 and depositing a connection layer 2 on the carrier board 1 by plasma enhanced chemical vapor deposition (PECVD).

Specifically, the carrier board 1 is a rigid plate; and preferably, the carrier board 1 is a glass plate.

Specifically, the connection layer 2 can be a $SiO_2$ layer or a $SiN_x$ layer. The connection layer 2 provides an effect of enhancing interface bonding strength between a flexible base plate 3 and the carrier board 1 and also serves as a release layer to help readily separate the flexible base plate 3 and the carrier board 1 from each other, and may also functions as an isolation layer to reduce damage caused on a soft glass plate 31 of the flexible base plate 3 during a laser based separation process.

Step 2: forming a flexible base plate 3 on the connection layer 2, wherein the flexible base plate 3 comprises a soft glass plate 31 and a thermal isolation layer 32 that is provided on at least one side of the soft glass plate 31.

Specifically, the thermal isolation layer 32 is formed of a temperature-resistant insulating thermally-isolating material, such as zirconium dioxide ($ZrO_2$). The thermal isolation layer 32 can effectively reduce thermal impact applied to the soft glass plate 31 by high energy density laser beams of a high temperature process, an excimer laser annealing (ELA) process, and a laser based separation process so as to prevent increase of brittleness of the soft glass plate.

Step 3: forming a blocking layer 4 on the flexible base plate 3.

Specifically, the blocking layer 4 comprises a $SiO_2$ layer, a $SiN_x$ layer, or a composite layer formed by alternately stacking $SiO_2$ layer(s) and $SiN_x$ layer(s).

Step 4: forming a display structure unit 5 and a package structure unit 6 that is arranged on the display structure unit 5 on the blocking layer 4.

Step 5: referring to FIGS. 3-7, applying a laser based process to separate the carrier board 1 and the flexible base plate 3 with the connection layer 2 attached to the flexible base plate 3 so as to obtain a flexible display device, wherein the flexible display device comprises the flexible base plate 3, the connection layer 2 that is on a lower surface of the flexible base plate 3, a blocking layer 4 that is on an upper surface of the flexible base plate 3, the display structure unit 5 on the blocking layer 4, and the package structure unit 6 on the display structure unit 5.

Figure 3:
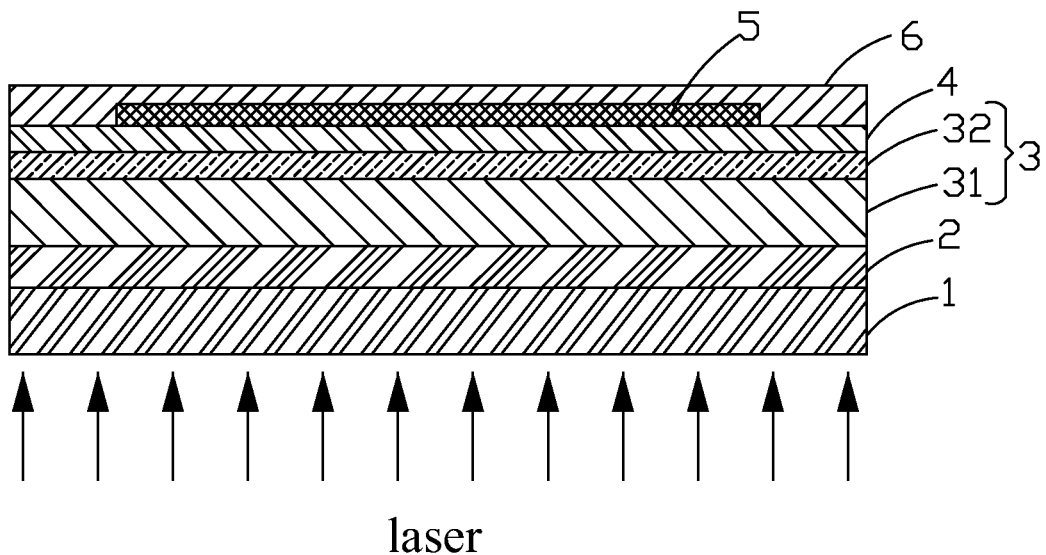
FIGS. 3-4 are schematic views illustrating step 5 of the method for manufacturing the flexible display device according to a first embodiment of the present invention.
Figure 4:
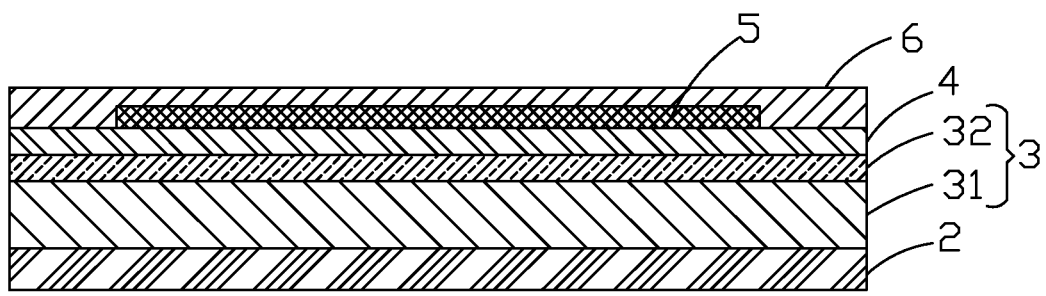

Referring to FIGS. 3-4, which are schematic views illustrating Step 5 of the method for manufacturing the flexible display device according to a first embodiment of the present invention, in the first embodiment, the flexible base plate 3 comprises a soft glass plate 31 and a thermal isolation layer 32 arranged on a side of the soft glass plate 31 that is close to the blocking layer 4.

Figure 5:
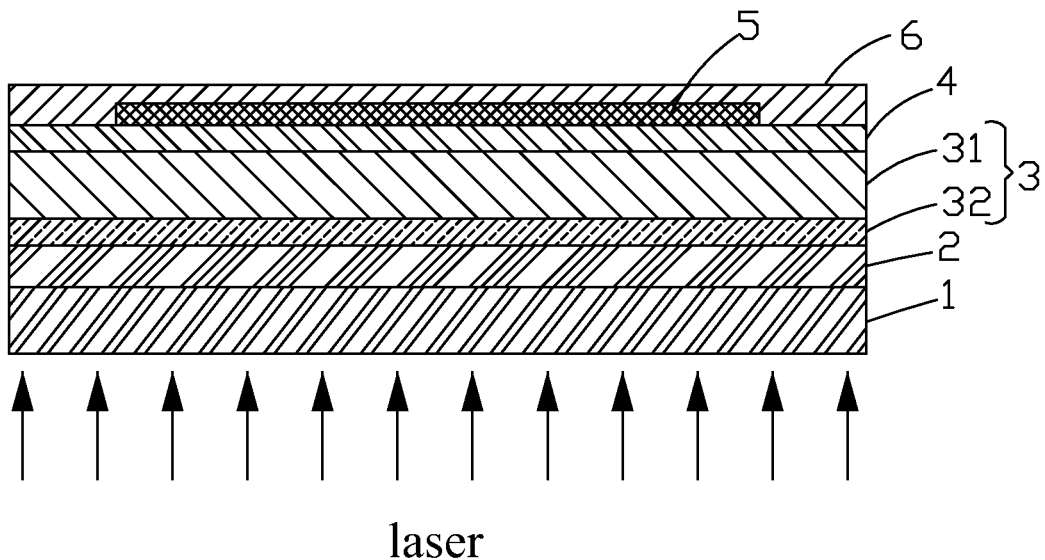
FIGS. 5-6 are schematic views illustrating step 5 of the method for manufacturing the flexible display device according to a second embodiment of the present invention.
Figure 6:
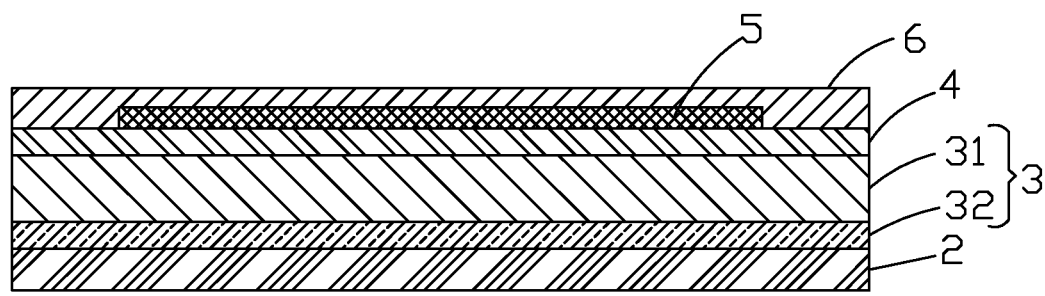

Referring to FIGS. 5-6, which are schematic views illustrating Step 5 of the method for manufacturing the flexible display device according to a second embodiment of the present invention, in the second embodiment, the flexible base plate 3 comprises a soft glass plate 31 and a thermal isolation layer 32 arranged on a side of the soft glass plate 31 that is close to the connection layer 2.

Figure 7:
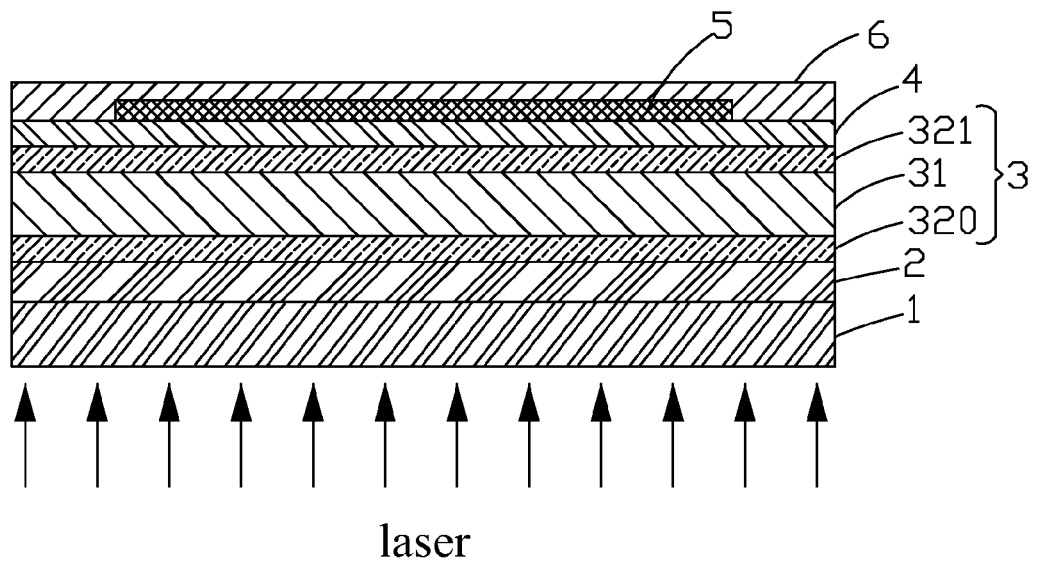
FIGS. 7-8 are schematic views illustrating step 5 of the method for manufacturing the flexible display device according to a third embodiment of the present invention.
Figure 8:
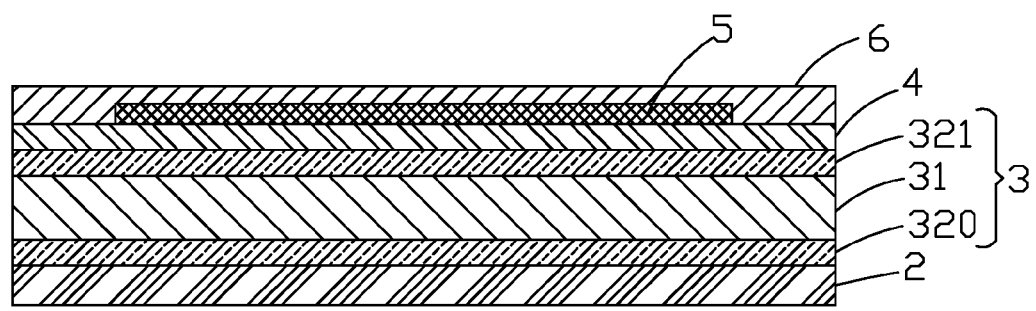

Referring to FIGS. 7-8, which are schematic views illustrating Step 5 of the method for manufacturing the flexible display device according to a third embodiment of the present invention, in the third embodiment, the flexible base plate 3 comprises a soft glass plate 31, a first thermal isolation layer 320 arranged on a side of the soft glass plate 31 that is close to the connection layer 2, and a second thermal isolation layer 321 arranged on a side of the soft glass plate 31 that is close to the blocking layer 4.

Specifically, the display structure unit 5 comprises an OLED display component so that the flexible display device of the present invention is a flexible OLED display device.

In the above-described method for manufacturing a flexible display device, a connection layer is used to replace a release layer and a bonding layer that are commonly used in the prior art so as to enhance the bonding strength between a flexible backing plate and a rigid carrier board and to additionally function as a release layer for easily achieving separation between the flexible backing plate and the rigid carrier board; and further, a thermal isolation layer is provided on one side or two sides of the soft glass plate to isolate heat generated in a high temperature process, an ELA process, or a laser based separation process and thus reduce thermal impact caused the heat on the soft glass plate and the display device so as to prevent cracking resulting from increase of brittleness of the soft glass plate and enhance performance of a flexible display device.

Referring to FIGS. 4, 6, and 8, the present invention further provides a flexible display device, which comprises a flexible base plate 3, a connection layer 2 arranged on a lower surface of the flexible base plate 3, a blocking layer 4 arranged on the flexible base plate 3, a display structure unit 5 arranged on the blocking layer 4, and a package structure unit 6 arranged on the display structure unit 5;

wherein the flexible base plate 3 comprises a soft glass plate 31 and a thermal isolation layer 32 that is provided on at least one side of the soft glass plate 31.

Referring to FIG. 4, a flexible display device according to a first embodiment of the present invention is illustrated. In the instant embodiment, the flexible base plate 3 comprises a soft glass plate 31 and a thermal isolation layer 32 arranged on a side of the soft glass plate 31 that is close to the blocking layer 4.

Referring to FIG. 6, a flexible display device according to a second embodiment of the present invention is illustrated. In the instant embodiment, the flexible base plate 3 comprises a soft glass plate 31 and a thermal isolation layer 32 arranged on a side of the soft glass plate 31 that is close to the connection layer 2.

Referring to FIG. 8, a flexible display device according to a third embodiment of the present invention is illustrated. In the instant embodiment, the flexible base plate 3 comprises a soft glass plate 31, a first thermal isolation layer 320 arranged on a side of the soft glass plate 31 that is close to the connection layer 2, and a second thermal isolation layer 321 arranged on a side of the soft glass plate 31 that is close to the blocking layer 4.

Specifically, the carrier board 1 is a rigid plate; and preferably, the carrier board 1 is a glass plate.

Specifically, the connection layer 2 can be a $SiO_2$ layer or a $SiN_x$ layer. The connection layer 2 provides an effect of enhancing interface bonding strength between a flexible base plate 3 and the carrier board 1 and also serves as a release layer to help readily separate the flexible base plate 3 and the carrier board 1 from each other, and may also functions as an isolation layer to reduce damage caused on a soft glass plate 31 of the flexible base plate 3 during a laser based separation process.

Specifically, the thermal isolation layer 32 is formed of a temperature-resistant insulating thermally-isolating material, such as zirconium dioxide ($ZrO_2$). The thermal isolation layer 32 can effectively reduce thermal impact applied to the soft glass plate 31 by high energy density laser beams of a high temperature process, an ELA process, and a laser based separation process so as to prevent increase of brittleness of the soft glass plate.

Specifically, the blocking layer 4 comprises a $SiO_2$ layer, a $SiN_x$ layer, or a composite layer formed by alternately stacking $SiO_2$ layer(s) and $SiN_x$ layer(s).

Specifically, the display structure unit 5 comprises an OLED display component so that the flexible display device of the present invention is a flexible OLED display device.

In summary, the present invention provides a method for manufacturing a flexible display device and a flexible display device so manufactured. The method for manufacturing a flexible display device according to the present invention uses a connection layer to replace a release layer and a bonding layer that are commonly used in the prior art so as to enhance the bonding strength between a flexible backing plate and a rigid carrier board and to additionally function as a release layer for easily achieving separation between the flexible backing plate and the rigid carrier board; and further, a thermal isolation layer is provided on one side or two sides of the soft glass plate to isolate heat generated in a high temperature process, an ELA process, or a laser based separation process and thus reduce thermal impact caused the heat on the soft glass plate and the display device so as to prevent cracking resulting from increase of brittleness of the soft glass plate and enhance performance of a flexible display device.

Based on the description given above, those having ordinary skills of the art may easily contemplate various changes and modifications of the technical solution and technical ideas of the present invention and all these changes and modifications are considered within the protection scope of right for the present invention.

What is claimed is:
1. A method for manufacturing a flexible display device, comprising the following steps:
 (1) providing a carrier board and depositing a connection layer on the carrier board by plasma enhanced chemical vapor deposition (PECVD);

(2) forming a flexible base plate on the connection layer, wherein the flexible base plate comprises a soft glass plate and a thermal isolation layer that is provided on at least one side of the soft glass plate;

(3) forming a blocking layer on the flexible base plate;

(4) forming a display structure unit and a package structure unit that is arranged on the display structure unit on the blocking layer; and (5) applying a laser based process to separate the carrier board and the flexible base plate with the connection layer attached to the flexible base plate so as to obtain a flexible display device, wherein the flexible display device comprises the flexible base plate, the connection layer that is on a lower surface of the flexible base plate, a blocking layer that is on an upper surface of the flexible base plate, the display structure unit on the blocking layer, and the package structure unit on the display structure unit;

wherein the thermal isolation layer is arranged on a side of the soft glass plate that is close to the connection layer.

2. The method for manufacturing the flexible display device as claimed in claim 1, wherein the flexible base plate comprises an additional thermal isolation layer arranged on a side of the soft glass plate that is close to the blocking layer.

3. The method for manufacturing the flexible display device as claimed in claim 1, wherein the connection layer comprises a $SiO_2$ layer or a $SiN_x$ layer; the thermal isolation layer is formed of a temperature-resistant insulating thermally-isolating material; and the blocking layer comprises one of a $SiO_2$ layer, a $SiN_x$ layer, and a composite layer formed by alternately stacking a $SiO_2$ layer and a $SiN_x$ layer.

4. A flexible display device, comprising a flexible base plate, a connection layer arranged on a lower surface of the flexible base plate, a blocking layer arranged on the flexible base plate, a display structure unit arranged on the blocking layer, and a package structure unit arranged on the display structure unit;

wherein the flexible base plate comprises a soft glass plate and a thermal isolation layer that is provided on at least one side of the soft glass plate; and wherein the thermal isolation layer is arranged on a side of the soft glass plate that is close to the connection layer.

5. The flexible display device as claimed in claim 4, wherein the flexible base plate comprises an additional thermal isolation layer arranged on a side of the soft glass plate that is close to the blocking layer.

6. The flexible display device as claimed in claim 4, wherein the connection layer comprises a $SiO_2$ layer or a $SiN_x$ layer; the thermal isolation layer is formed of a temperature-resistant insulating thermally-isolating material; and the blocking layer comprises one of a $SiO_2$ layer, a $SiN_x$ layer, and a composite layer formed by alternately stacking a $SiO_2$ layer and a $SiN_x$ layer.

7. The flexible display device as claimed in claim 6, wherein the temperature-resistant insulating thermally-isolating material comprises zirconium dioxide.

8. A flexible display device, comprising a flexible base plate, a connection layer arranged on a lower surface of the flexible base plate, a blocking layer arranged on the flexible base plate, a display structure unit arranged on the blocking layer, and a package structure unit arranged on the display structure unit;

wherein the flexible base plate comprises a soft glass plate and a thermal isolation layer that is provided on at least one side of the soft glass plate;

wherein the thermal isolation layer is arranged on a side of the soft glass plate that is close to the connection layer;

wherein the flexible base plate comprises an additional thermal isolation layer arranged on a side of the soft glass plate that is close to the blocking layer; and wherein the connection layer comprises a $SiO_2$ layer or a $SiN_x$ layer; the thermal isolation layer is formed of a temperature-resistant insulating thermally-isolating material; and the blocking layer comprises one of a $SiO_2$ layer, a $SiN_x$ layer, and a composite layer formed by alternately stacking a $SiO_2$ layer and a $SiN_x$ layer.

9. The flexible display device as claimed in claim 8, wherein the connection layer comprises a $SiO_2$ layer or a $SiN_x$ layer.

10. The flexible display device as claimed in claim 8, wherein the thermal isolation layer is formed of a temperature-resistant insulating thermally-isolating material.

11. The flexible display device as claimed in claim 10, wherein the temperature-resistant insulating thermally-isolating material comprises zirconium dioxide.

12. The flexible display device as claimed in claim 8, wherein the blocking layer comprises one of a $SiO_2$ layer, a $SiN_x$ layer, and a composite layer formed by alternately stacking a $SiO_2$ layer and a $SiN_x$ layer.

* * * * *